United States Patent [19]
Liu et al.

[11] Patent Number: 5,753,545
[45] Date of Patent: May 19, 1998

[54] EFFECTIVE CONSTANT DOPING IN A GRADED COMPOSITIONAL ALLOY

[75] Inventors: Takyiu Liu; Chanh Nguyen, both of Newbury Park, Calif.

[73] Assignee: Hughes Electronics Corporation, El Segundo, Calif.

[21] Appl. No.: 349,097

[22] Filed: Dec. 1, 1994

[51] Int. Cl.$^6$ ................................................. H01L 21/203
[52] U.S. Cl. .............................................. 438/172; 606/936
[58] Field of Search ............................ 437/128, 133, 437/110, 105, 129; 148/DIG. 67, DIG. 160; 257/191, 15, 17

[56] References Cited

U.S. PATENT DOCUMENTS

| | | | |
|---|---|---|---|
| 4,794,611 | 12/1988 | Hara et al. | 372/45 |
| 5,091,756 | 2/1992 | Iga et al. | 257/17 |
| 5,170,407 | 12/1992 | Schubert et al. | 372/96 |
| 5,185,647 | 2/1993 | Vasquez | 257/17 |
| 5,198,682 | 3/1993 | Wu et al. | 257/192 |
| 5,289,486 | 2/1994 | Iga et al. | 372/45 |
| 5,296,720 | 3/1994 | Wen et al. | 257/21 |
| 5,324,959 | 6/1994 | Nakamura et al. | 257/17 |
| 5,365,077 | 11/1994 | Metzer et al. | 257/15 |
| 5,386,156 | 1/1995 | Henderson et al. | 257/15 |
| 5,420,059 | 5/1995 | Mohammad et al. | 437/110 |
| 5,528,051 | 6/1996 | Nuyen | 257/17 |

FOREIGN PATENT DOCUMENTS

| | | | |
|---|---|---|---|
| 2-246381 | 10/1990 | Japan | 437/110 |
| 4-282825 | 10/1992 | Japan | 437/110 |
| 5-3160 | 1/1993 | Japan | 437/110 |
| 6-244115 | 2/1994 | Japan | 437/110 |

*Primary Examiner*—John Niebling
*Assistant Examiner*—S. Mulpuri
*Attorney, Agent, or Firm*—V. D. Duraiswamy; W. K. Denson-Low

[57] ABSTRACT

Epitaxial growth of a chirped superlattice with constant dopings is achieved with minimal growth interruption time. This is done by doping only one of the two compositions during growth of its layer. For example, in the growth of a plurality of alternating layers of InP and GaInAs to form the superlattice, either the InP layers are doped with an n-type dopant, such as silicon, or the GaInAs layers are doped with a p-type dopant, such as beryllium. Alternatively, InP can equally be doped p-type (with beryllium) and GaInAs can be doped n-type (with silicon). In either case, the doping scheme described herein is easily done during molecular beam epitaxial growth by opening and closing the shutter of the dopant (silicon or beryllium) source cell at the appropriate times. To the electrical carriers, the doping superlattice scheme of the present invention presents a uniform doping without any need to change the doping cell temperature. This in turn allows improved controllability and minimal interface contamination.

24 Claims, 2 Drawing Sheets

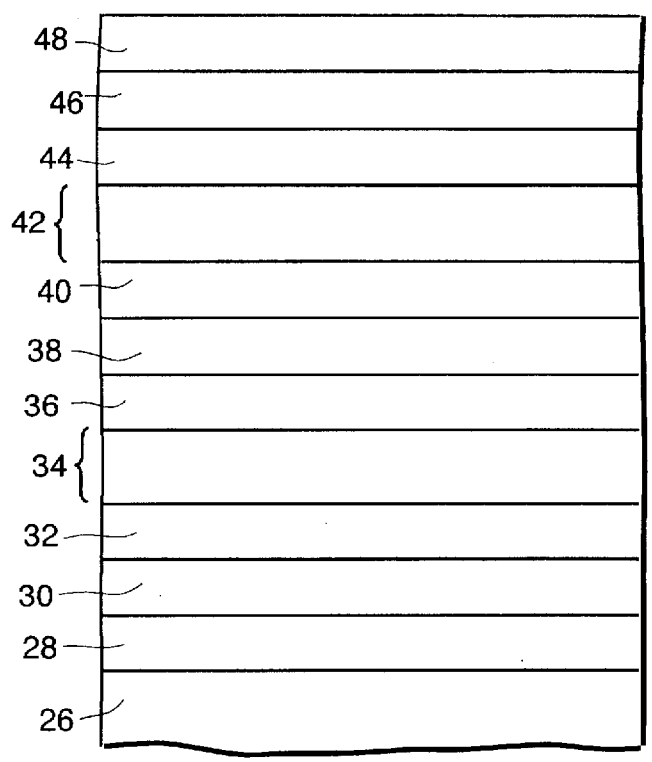
FIG. 5.
FIG. 6.

EFFECTIVE CONSTANT DOPING IN A GRADED COMPOSITIONAL ALLOY

CROSS-REFERENCE TO RELATED APPLICATION

The present application is related to application Ser. No. 08/349,096, filed on even date herewith [PD-94179]. That application is directed to the use of parabolic compositional grading of the base-collector in a double heterojunction bipolar transistor. The present application is directed to the provision of an effective constant doping of the base-collector, whether the compositional profile is linear or parabolic or other profile.

BACKGROUND OF THE INVENTION

1. Field of the Invention

The present invention relates generally to III–V semiconductor devices, and, more particularly, to compound semiconductors in a graded superlattice.

2. Description of Related Art

A graded compound semiconductor is usually implemented with molecular beam epitaxy as a gradient ("chirped") superlattice. For example, to grade from InP to GaInAs, one would typically have a short period (say 30 Å) superlattice where the thickness of InP component decreases from the full period to zero while the thickness of the GaInAs component increases correspondingly from zero to the full period when going from the InP to the GaInAs end. Doping such a chirped superlattice uniformly is difficult because the two components have in general different growth rates.

The growth rate, doping flux and bulk doping are related through the relationship:

bulk doping=doping flux/growth rate.

Since the growth rates of the components in the gradient (chirped) superlattice are usually different, the designer is forced to accept one of the following compromises:

(1) Maintain a constant doping flux and therefore different dopings in the different superlattice components due to the growth rate differences. However, this approach results in an effective doping gradient, discussed with respect to FIG. 2, below.

(2) Insert extensive growth interruptions (say 2 minutes) every time a different component is being grown. This allows time to change the doping cell temperature for a corrected doping flux, and is discussed with respect to FIG. 3, below. However, this approach unnecessarily exposes the growth surface to possible background contamination in the growth chamber.

No prior art is known to the inventors that is related to achieving a constant doping in a gradient (chirped) superlattice. However, the foregoing compromises are well-known to those skilled in the molecular beam epitaxy art.

Thus, a doping method which provides an essentially constant concentration throughout the chirped superlattice is required.

SUMMARY OF THE INVENTION

In accordance with the invention, epitaxial growth of a chirped superlattice with constant dopings is achieved with minimal growth interruption time. This is done by doping only one of the two compositions during growth of its layer. For example, in the growth of a plurality of alternating layers of InP and GaInAs to form the superlattice, either the InP or the GaInAs layers are doped with a dopant. The dopant is silicon for n-type doping and beryllium for p-type doping in the case of both InP and GaInAs. The doping is easily done during molecular beam epitaxial growth by opening and closing the shutter of the dopant (silicon or beryllium) source cell at the appropriate times.

To the electrical carriers, the doping superlattice scheme of the present invention presents a uniform doping without any need to change the doping cell temperature. This in turn allows improved controllability and minimal interface contamination.

BRIEF DESCRIPTION OF THE DRAWINGS

FIG. 5 is a cross-sectional view of the device obtained by the process of the invention; and FIG. 6, on coordinates of current (I, in microAmps) and voltage (V, in volts), are plots of output characteristics.

DESCRIPTION OF THE PREFERRED EMBODIMENTS

Figure 1:
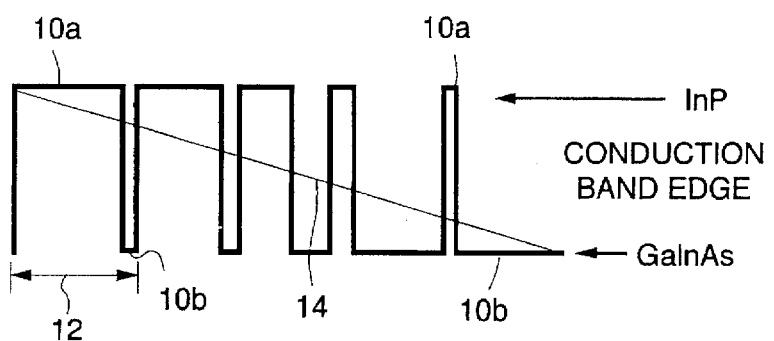
FIG. 1 is a schematic illustration of the conduction bandedge of a chirped superlatice graded from InP to GaInAs.

A compositional graded compound semiconductor is usually realized as a chirped superlattice in gas-source molecular beam epitaxy (GSMBE). In the following discussion, a description of a particular materials system is provided, namely, the grading from InP to GaInAs. However, the discussion is applicable to the doping of any graded compound where the growth rates of the two target materials are different. FIG. 1 shows a schematic illustration of the conduction bandedge of a chirped superlattice graded from InP to GaInAs. Curve 10 represents the composition that is grown, here, comprising a plurality of alternating layers of InP and GaInAs, with one period 12 represented by a pair of InP and GaInAs layers. It will be seen that at the left side of the Figure, the InP layer 10a is comparatively thicker than the GaInAs layer 10b. The first InP layer 10a is formed on an underlying InP layer (see FIG. 5). As successive periods 12 are grown, the ratio of layer thicknesses changes, so that at the final period, the GaInAs layer 10b is comparatively thicker than the InP layer 10a. The effective conduction band-edge, $E_c$, is represented by Curve 14, shown here as linear.

Figure 2:
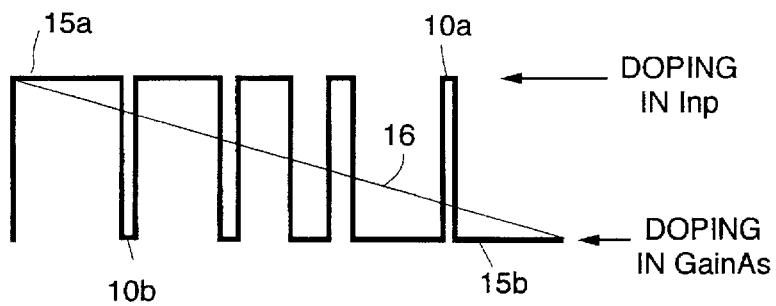
FIG. 2 is a schematic illustration of the doping profile of the chirped superlattice of FIG. 1, resulting from employing a constant doping flux, and illustrating the effective doping concentration.

Typically, the growth rate of GaInAs is 1 μm/hr and that of InP is 0.532 μm/hr. If a constant doping flux (and therefore minimal growth interruption) is used, then a non-intentional doping grade is developed. FIG. 2 depicts a schematic illustration for the resulting doping. The level of doping in InP is represented at 15a, while the level of doping in GaInAs is represented at 15b. The doping concentration in InP is higher than in GaInAs because of the lower growth rate. Curve 16, which is the effective doping concentration, is seen to be graded.

Figure 3:
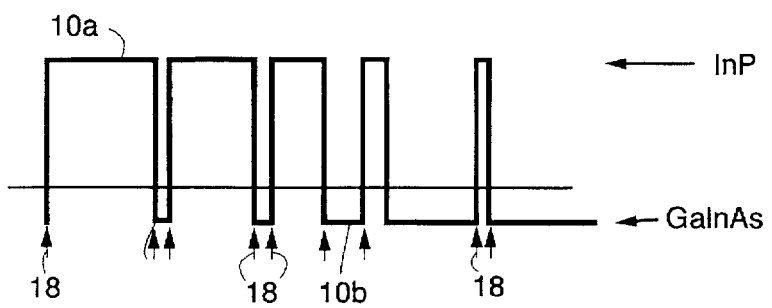
FIG. 3 is a schematic illustration of the chirped superlattice of FIG. 1, but with a growth interruption at every hetero-interface to accommodate the time required to change the temperature of the dopant cell in order to achieve a constant effective doping concentration profile.

Another approach is to change the doping cell temperature at every interface: The grower would insert growth interruption at every hetero-interface and re-adjust the doping cell temperature. FIG. 3 depicts the results of this growth; the arrows 18 indicate the locations of all the hetero-interfaces. The extensive growth interruptions cause background contamination to be incorporated at the interfaces unnecessarily.

Figure 4A:
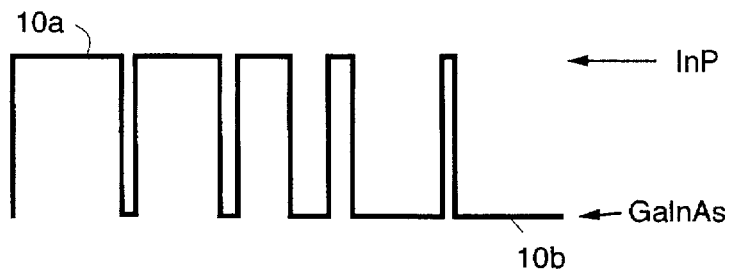
FIG. 4a is a schematic illustration of the chirped superlattice of FIG. 1, and is used as an aid in understanding FIG. 4b

In accordance with the invention, the doping is confined to only one of the two components in the superlattice, but the doping is increased correspondingly so that the weighted average of the doping is at the intended doping level. The doping cell temperature is not changed. See FIG. 4 for a schematic illustration where only the InP is being doped. Since only one component is being doped, there is no need to re-adjust the doping cell temperature.

The doping level of the doping superlattice required so that the weighted average is at the intended doping level is determined by the following equation:

$$D_s = (P_s/t) * d$$

where $D_s$ is the superlattice doping, $P_s$ is the superlattice period, t is the thickness of the doped layer in each period, and d is the intended doping level.

The present invention provides a novel doping scheme (in the form of a doping superlattice) such that the chirped superlattice appears to be uniformly doped to the carriers.

Figure 4B:
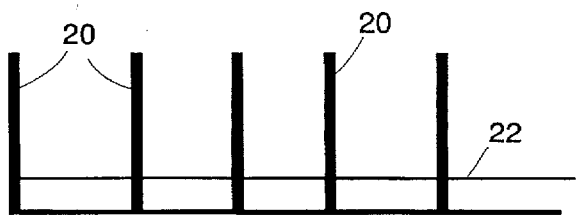
FIG. 4b illustrates the resultant effective constant doping achieved by the process of the invention.

In one embodiment, as the InP thickness is changing from one period 12 to the next, as discussed above, the doping (silicon or beryllium) shutter is kept open the same amount of time for each InP layer. The result is that there is a fixed amount of donors (in the case of silicon) or acceptors (in the case of beryllium) here, electrons (in the case of silicon) or holes (in the case of beryllium in the InP layer. To the carriers, this appears to be a "constant" doping. The constant doping of each InP layer is shown in FIG. 4b as layers 20 of constant thickness; the resulting doping is effectively constant, as shown by line 22.

To test whether this concept works or not, the doping scheme of the invention was incorporated into an actual device that requires a constant doping in a graded layer for proper operation. It will be appreciated by those skilled in this art that direct measurement of the effective constant doping is very difficult. The device under test had a chirped superlattice grade between the InP region an the GaInAs region, similar to that illustrated in FIG. 1, but with the thicknesses of the individual layers designed to result in an effective parabolic compositional grade, and required a constant p and a constant n doping.

FIG. 5 provides a cross-sectional view of the device 24. For clarity, the patterning of the device 24 to expose the base, collector, an emitter contact layers and the fabrication of ohmic contacts to the contact layers is omitted. A semi-insulating substrate 26 comprises InP. A collector contact layer 28 is formed on the substrate and comprises n-doped GaInAs, 700 nm thick and doped t a concentration of $1 \times 10^{19}$ $cm^{-3}$. A subcollector layer 30 is formed on the collector contact layer 28 and comprises n-doped InP, 100 nm thick and doped to a concentration of $1 \times 10^{19}$ $cm^{-3}$. A collector layer 32 is formed on the subcollector layer 30 and also comprises n-doped InP, 750 nm thick and doped to a concentration of $2.4 \times 10^{16}$ $cm^{-3}$. A base-collector grading layer 34 is formed on the collector layer 32 and employs the doping superlattice of the present invention, starting with n-doped (silicon) InP (concentration at $1 \times 10^{17}$ $cm^{-3}$), 50 nm, and concluding with p-doped (beryllium) GaInAs (concentration at $1 \times 10^{17}$ $cm^{-3}$), 50 nm. Specifically, the n-doped part of the grade consists of a chirped superlattice having 17 periods, each period being about 3 nm thick, which results in a total thickness of about 50 nm for the n-doped region. The p-doped region is similarly constructed.

Next, a base spacer layer 36 is formed on the graded base-collector layer 34 and comprises p-doped GaInAs, 10 nm thick and doped to a concentration of $1 \times 10^{17}$ $cm^{-3}$. A base layer 38 is formed on the base spacer layer 36, also comprising p-doped GaInAs, 50 nm thick and doped to a concentration of $2 \times 10^{19}$ $cm^{-3}$. Another base spacer layer 40 is formed on the base layer 38, also comprising p-doped GaInAs, 10 nm thick and doped to a concentration of $1 \times 10^{18}$ $cm^{-3}$. An emitter-base superlattice grading layer 42 is formed on top of the base spacer layer 40, starting with p-doped GaInAs (concentration at $1 \times 10^{18}$ $cm^{-3}$), 9.9 nm, and concluding with n-doped AlInAs (concentration at $8 \times 10^{17}$ $cm^{-3}$), 19.8 nm. An emitter layer 44 is formed on the emitter-base grading layer 42, comprising n-doped AlInAs, 120 nm thick and doped to a concentration of $8 \times 10^{17}$ $cm^{-3}$. An emitter contact layer 46 is formed on the emitter layer 44, also comprising n-doped AlInAs, 70 nm thick and doped to a concentration of $1 \times 10^{19}$ $cm^{-3}$. A cap layer 48 is formed on the emitter contact layer 46 and comprises n-doped GaInAs, 100 nm thick and doped to a concentration of $1 \times 10^{19}$ $cm^{-3}$.

But for the parabolic grade and the doping superlattice, the device 24 described above is a conventional double heterojunction bipolar transistor (DHBT). Thus, the thicknesses and dopant concentrations are to be considered as exemplary only.

The proper operation of the device 24 requires a well-controlled doping dipole; that is, the effective dopings in the graded regions must be constant. As can be seen from FIG. 6, the output characteristics has a very low knee voltage and minimal kink characteristics. Specifically, FIG. 6 shows the output collector current as a function of collector voltage, for different values of base current (in steps of 20 μA), in common-emitter configuration.

The process of the present invention is expected to have a significant impact on a number of microwave devices, including, but not limited to, (1) analog-to-digital (A/D) devices; (2) radar system very-high-frequency (VHF) switches operating above 200 MHz at>200 V, radar system wideband (7 to 11 GHz); (3) high power (>8 W), high gain (>9 dB), high efficiency (>50%) power amplifiers with heterojunction bipolar transistor (HBT) of breakdown voltage, open-circuited collector-base (BVcbo)>25 V maximum frequency of oscillation (Fmax)>90 GHz power cell 2 W @ 50% power-added efficiency (PAE); (4) V-band power devices; and (5) C- and Ku-band power devices.

Thus, there has been disclosed a method of obtaining an effective constant doping in a graded compositional alloy. It will be readily appreciated by those skilled in this art that changes or modifications of an obvious nature may be made, and all such changes and modifications are considered to fall within the scope of the invention as defined by the appended claims.

What is claimed is:

1. A method of doping a region in a semiconductor device having a graded compositional alloy to provide a constant doping level, said method comprising forming said region sandwiched between two separate layers, one having a first composition and the other having a second composition, said graded compositional alloy comprising a plurality of alternating layers of said first composition and said second composition, wherein one of said compositions is doped with a dopant, wherein said doping of said one of said compositions is conducted for an amount of time which is essentially identical for each layer of said composition in said plurality of alternating layers.

2. The method of claim 1 wherein said first composition and said second composition each consist essentially of a III–V material.

3. The method of claim 2 wherein said first composition consists essentially of InP and said second composition consists essentially of GaInAs.

4. The method of claim 3 wherein said one of said two separate layers having said region sandwiched therebetween comprises said first composition consisting essentially of InP which is n-doped and said other of said two separate layers comprises said second composition consisting essentially of GaInAs which is p-doped.

5. The method of claim 4 wherein said InP is doped with silicon to form said n-InP.

6. The method of claim 4 wherein said GaInAs is doped with beryllium to form said p-GaInAs.

7. The method of claim 4 wherein said plurality of alternating layers of said first composition and said second composition consists essentially of InP which is n-doped and GaInAs which is undoped.

8. The method of claim 4 wherein said plurality of alternating layers of said first composition and said second composition consists essentially of InP which is undoped and GaInAs which is p-doped.

9. The method of claim 1 wherein said graded compositional alloy comprises a chirped superlattice having a plurality of periods, each period comprising one of said layers of said first composition and one of said layers of said second composition, said layer of said first composition and said layer of said second composition each having a thickness, each period characterized by a ratio of said thickness of said layer of said first composition and said layer of said second composition, said ratio of said thickness for said plurality of periods varying monotonically with either (i) the distance from said one of said two separate layers having said region sandwiched therebetween having said first composition or (ii) the distance from said other of said two separate layers having said second composition, such that said chirped superlattice mimics a compositionally varying alloy.

10. The method of claim 9 wherein said ratio of said thickness for said plurality of periods varies linearly such that said chirped superlattice mimics a linearly varying alloy composition.

11. The method of claim 9 wherein said ratio of said thickness for said plurality of periods varies parabolically such that said chirped superlattice mimics a parabolically varying alloy composition.

12. The method of claim 1 wherein said doping of said one of said compositions is conducted by opening a shutter of a dopant source for an amount of time which is essentially identical for each layer of said composition in said plurality of alternating layers.

13. A method of doping a region in a semiconductor device having a superlattice comprising an n-part and a p-part both having a constant doping level, said method comprising forming said region sandwiched between two separate layers, one having a first composition and the other having a second composition, said superlattice comprising a plurality of alternating layers of said first composition and said second composition, wherein only one of said compositions is doped with a dopant in said n-part and only one of said compositions is doped with a dopant in said p-part, wherein said doping of said one of said compositions in said n-part is conducted for an amount of time which is essentially identical for each layer of said composition in said n-part and said doping of said one of said compositions in said p-part is conducted for an amount of time which is essentially identical for each layer of said composition in said p-part.

14. The method of claim 13 wherein said first composition and said second composition each consist essentially of a III–V material.

15. The method of claim 14 wherein said first composition consists essentially of InP and said second composition consists essentially of GaInAs.

16. The method of claim 15 wherein said first composition consists essentially of n-InP and said second composition consists essentially of p-GaInAs.

17. The method of claim 16 wherein said InP is doped with silicon to form said n-InP.

18. The method of claim 16 wherein said GaInAs is doped with beryllium to form said p-GaInAs.

19. A method of doping a region in a semiconductor device having a superlattice comprising an n-part and a p-part both having a constant doping level, said method comprising forming said region sandwiched between two separate layers, one having a first composition and the other having a second composition, said superlattice comprising a plurality of alternating layers of said first composition and said second composition, wherein only one of said compositions is doped with a dopant in said n-part and only one of said compositions is doped with a dopant in said p-part, wherein said doping of said one of said compositions in said n-part is conducted by opening a shutter of a dopant source for an amount of time which is essentially identical for each layer of said composition in said n-part and said doping of said one of said compositions in said p-part is conducted by opening a shutter of a dopant source for an amount of time which is essentially identical for each layer of said composition in said p-part.

20. The method of claim 19 wherein said first composition and said second composition each consist essentially of a III–V material.

21. The method of claim 20 wherein said first composition consists essentially of InP and said second composition consists essentially of GaInAs.

22. The method of claim 21 wherein said first composition consists essentially of n-InP and said second composition consists essentially of p-GaInAs.

23. The method of claim 22 wherein said InP is doped with silicon to form said n-InP.

24. The method of claim 22 wherein said GaInAs is doped with beryllium to form said p-GaInAs.

* * * * *